(12) United States Patent
Tai et al.

(10) Patent No.: US 11,855,232 B2
(45) Date of Patent: *Dec. 26, 2023

(54) SEMICONDUCTOR PACKAGE AND FORMING METHOD THEREOF

(71) Applicant: Taiwan Semiconductor Manufacturing Company, Ltd., Hsinchu (TW)

(72) Inventors: Chih-Hsuan Tai, Taipei (TW); Hao-Yi Tsai, Hsinchu (TW); Yu-Chih Huang, Hsinchu (TW); Chih-Hao Chang, Hsinchu County (TW); Chia-Hung Liu, Hsinchu (TW); Ban-Li Wu, Hsinchu (TW); Ying-Cheng Tseng, Tainan (TW); Po-Chun Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/750,419

(22) Filed: May 23, 2022

(65) Prior Publication Data
US 2022/0285566 A1 Sep. 8, 2022

Related U.S. Application Data

(63) Continuation of application No. 16/747,503, filed on Jan. 20, 2020, now Pat. No. 11,374,136.
(Continued)

(51) Int. Cl.
*H01L 31/0203* (2014.01)
*H01L 31/18* (2006.01)
(Continued)

(52) U.S. Cl.
CPC .... *H01L 31/0203* (2013.01); *H01L 31/02002* (2013.01); *H01L 31/024* (2013.01); *H01L 31/1892* (2013.01)

(58) Field of Classification Search
None
See application file for complete search history.

(56) References Cited

U.S. PATENT DOCUMENTS 9,165,793 B1 * 10/2015 Wang ................... H01L 25/105
2011/0163457 A1 * 7/2011 Mohan ............ H01L 23/49822
257/E23.079

(Continued)

*Primary Examiner* — Evren Seven
(74) *Attorney, Agent, or Firm* — JCIPRNET

(57) ABSTRACT

A semiconductor package is provided. The semiconductor package includes a heat dissipation substrate including a first conductive through-via embedded therein; a sensor die disposed on the heat dissipation substrate; an insulating encapsulant laterally encapsulating the sensor die; a second conductive through-via penetrating through the insulating encapsulant; and a first redistribution structure and a second redistribution structure disposed on opposite sides of the heat dissipation substrate. The second conductive through-via is in contact with the first conductive through-via. The sensor die is located between the second redistribution structure and the heat dissipation substrate. The second redistribution structure has a window allowing a sensing region of the sensor die receiving light. The first redistribution structure is electrically connected to the sensor die through the first conductive through-via, the second conductive through-via and the second redistribution structure. A method of forming the semiconductor package is also provided.

13 Claims, 14 Drawing Sheets

Related U.S. Application Data

(60) Provisional application No. 62/906,726, filed on Sep. 27, 2019.

(51) Int. Cl.
*H01L 31/024* (2014.01)
*H01L 31/02* (2006.01)

(56) References Cited

U.S. PATENT DOCUMENTS

| | | | | |
|---|---|---|---|---|
| 2011/0180891 | A1* | 7/2011 | Lin | H01L 27/14625 |
| | | | | 257/E31.127 |
| 2013/0200528 | A1* | 8/2013 | Lin | H01L 24/97 |
| | | | | 257/774 |
| 2018/0026023 | A1* | 1/2018 | Lin | H01L 23/552 |
| | | | | 257/737 |
| 2018/0190617 | A1* | 7/2018 | Chew | H01L 25/50 |
| 2019/0393149 | A1* | 12/2019 | Wang | H01L 24/17 |
| 2020/0168570 | A1* | 5/2020 | So | H01L 24/20 |

\* cited by examiner

SEMICONDUCTOR PACKAGE AND FORMING METHOD THEREOF

CROSS-REFERENCE TO RELATED APPLICATION

This application is a continuation application of U.S. application Ser. No. 16/747,503, filed on Jan. 20, 2020, now allowed. The prior U.S. application Ser. No. 16/747,503 claims the priority benefit of U.S. provisional application Ser. No. 62/906,726, filed on Sep. 27, 2019. The entirety of the above-mentioned patent application is hereby incorporated by reference herein and made a part of this specification.

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Currently, integrated fan-out packages are becoming increasingly popular for their compactness. However, the heat dissipation is a challenge in a variety of packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
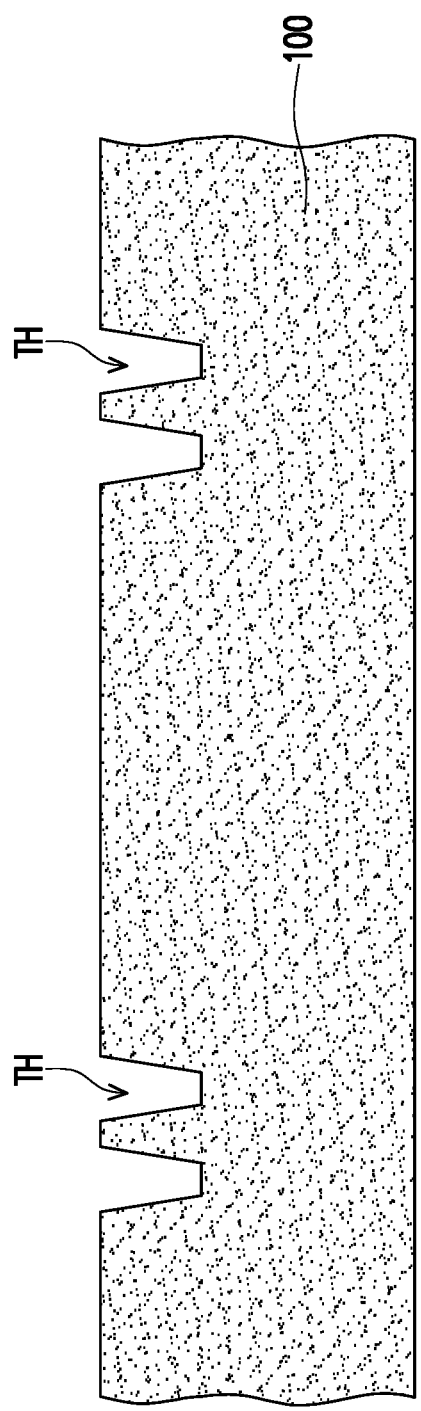
FIG. 1 to FIG. 14 are schematic cross-sectional views illustrating a manufacturing process of a semiconductor package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 14 are schematic cross-sectional views illustrating a manufacturing process of a semiconductor package 10 in accordance with some embodiments of the disclosure. Referring to FIG. 1, a heat dissipation substrate 100 is provided. In some embodiments, the heat dissipation substrate 100 has a high thermal conductivity greater than about 285 W/m*K or about 230 W/m*K. In some embodiments, the heat dissipation substrate 100 has a sufficient degree of rigidity such that the heat dissipation substrate 100 is able to withstand the following manufacturing processes while supporting the elements formed thereon. In some embodiments, the heat dissipation substrate 100 includes electrically insulating materials. For example, the material of the heat dissipation substrate 100 may include aluminum nitride, silicon carbide or a combination thereof, although other types of heat dissipation materials may be used. As illustrated in FIG. 1, a plurality of trenches TH having a predetermined depth are formed in the heat dissipation substrate 100. In some embodiments, the trenches TH are formed by a laser drilling process. In some alternative embodiments, the trenches in the heat dissipation substrate 100 are formed by photolithograph/etching process or other suitable patterning processes.

Figure 2:
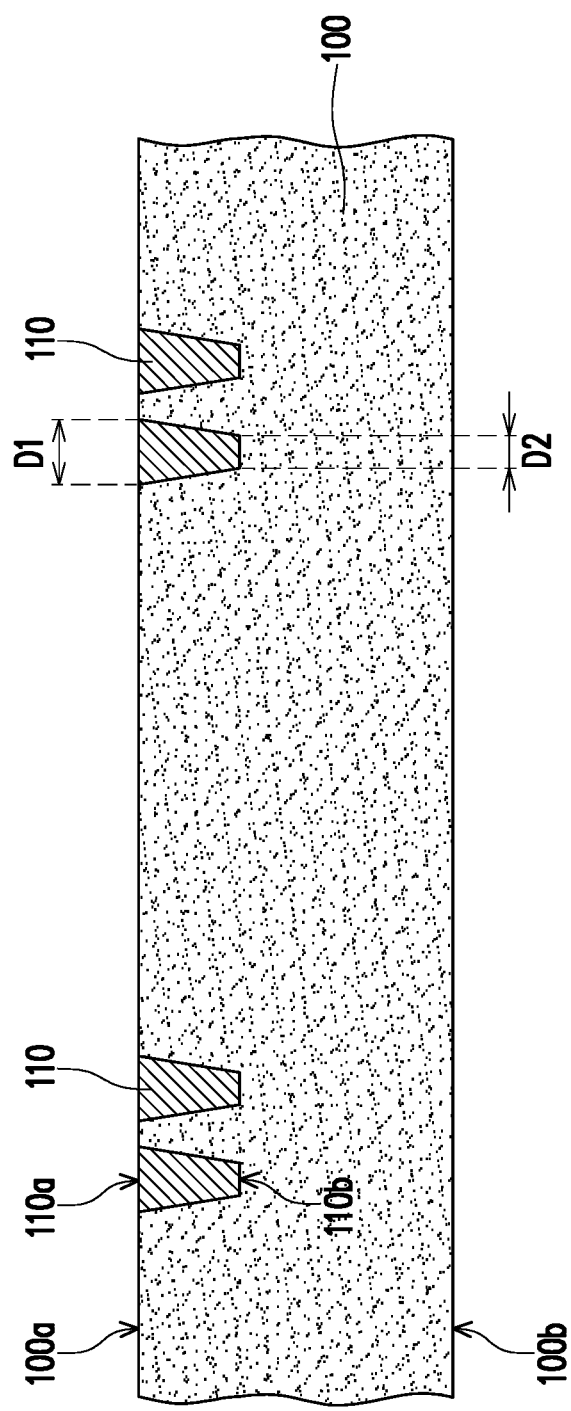

Referring to FIG. 1 and FIG. 2, a plurality of conductive through-vias 110 are formed in the trenches TH of the heat dissipation substrate 100. In some embodiments, the conductive through-vias 110 do not penetrate the heat dissipation substrate 100 at the beginning. Specifically, the heat dissipation substrate 100 has a first surface 100a and a second surface 100b opposite to the first surface 100a. The plurality of conductive through-vias 110 may extend from the first surface 100a of the heat dissipation substrate 100 toward the interior of the heat dissipation substrate 100. In other words, the conductive through-vias 110 are formed to be embedded in the heat dissipation substrate 100. The formation process of the conductive through-vias 110 may be attained by the following steps. First, a conductive material (not shown) is formed on the heat dissipation substrate 100 to fill the trenches TH. In some embodiments, the conductive material may entirely cover the first surface 100a of the heat dissipation substrate 100 and entirely fill the trenches TH. Then, a portion of the conductive material outside the trenches TH is removed to form the conductive through-vias 110 by, for example, a planarization process (such as a chemical mechanical polishing (CMP) process) or an etching process. In some embodiments, the conductive material may be formed by an electro-chemical plating process, chemical vapor deposition (CVD), physical vapor deposition (PVD), combinations thereof, or the like. In some embodiments, the conductive through-vias 110 may include copper, copper alloys, or the like.

In one embodiment, the method of forming the conductive through-vias 110 includes the following steps. First, a seed material layer (not shown) is formed over the heat dissipation substrate 100. In some embodiments, the seed material layer is blanketly formed over and is in direct contact with the heat dissipation substrate 100. In other words, the seed material layer may extend along and in direct contact with the top surface 100a of the heat dissipation substrate 100 as well as sidewalls and bottom surfaces of the trenches TH. The seed material layer may be formed through, for example, a sputtering process, a physical vapor deposition (PVD) process, or the like. In some embodiments, the seed material layer may include, for example, copper, titanium-copper alloy, or other suitable choice of materials. Then, a conductive material (not shown) is formed over the heat dissipation substrate 100 to fill up the trenches TH, so as to form a conductive layer on the seed material layer. In some embodiments, the conductive material may be formed by a plating process. The plating process is, for example, electro-plating, electroless-plating, immersion plating, or the like. In some embodiments, the conductive material includes, for example, copper, copper alloys, or the like. Then, portions of the conductive layer and the seed material layer outside the trenches TH are removed to render seed layers and conductive patterns, respectively, by a planarization process (such as a chemical mechanical polishing (CMP) process), an etching process, or a combination thereof. In some embodiments, the conductive patterns and the seed layers are collectively referred to as the conductive through-vias 110, wherein the seed layers are between the conductive patterns and the heat dissipation substrate 100. In some embodiments, the method of forming the conductive through-vias 110 does not include forming a photoresist layer.

As illustrated in FIG. 2, each of the conductive through-vias 110 has a first surface 110a and a second surface 110b opposite to the first surface 110a. In some embodiments, the first surfaces 110a of the conductive through-vias 110 are substantially coplanar with the first surface 100a of the heat dissipation substrate 100. In some embodiments, the second surfaces 110b of the conductive through-vias 110 are embedded in the heat dissipation substrate 100 at the beginning. In some embodiments, the conductive through-vias 110 may have tapered sidewalls, and the width of the conductive through-vias 110 is gradually decreased from the first surfaces 100a to the second surfaces 110b of the conductive through-vias 110. In other words, a dimension D1 (e.g., width) of the first surface 110a of conductive through-via 110 is greater than the dimension D2 (e.g., width) of the second surfaces 110b of the conductive through-via 110. However, in some alternative embodiments, the conductive through-vias embedded in the heat dissipation substrate 100 may have vertical sidewalls.

Figure 3:
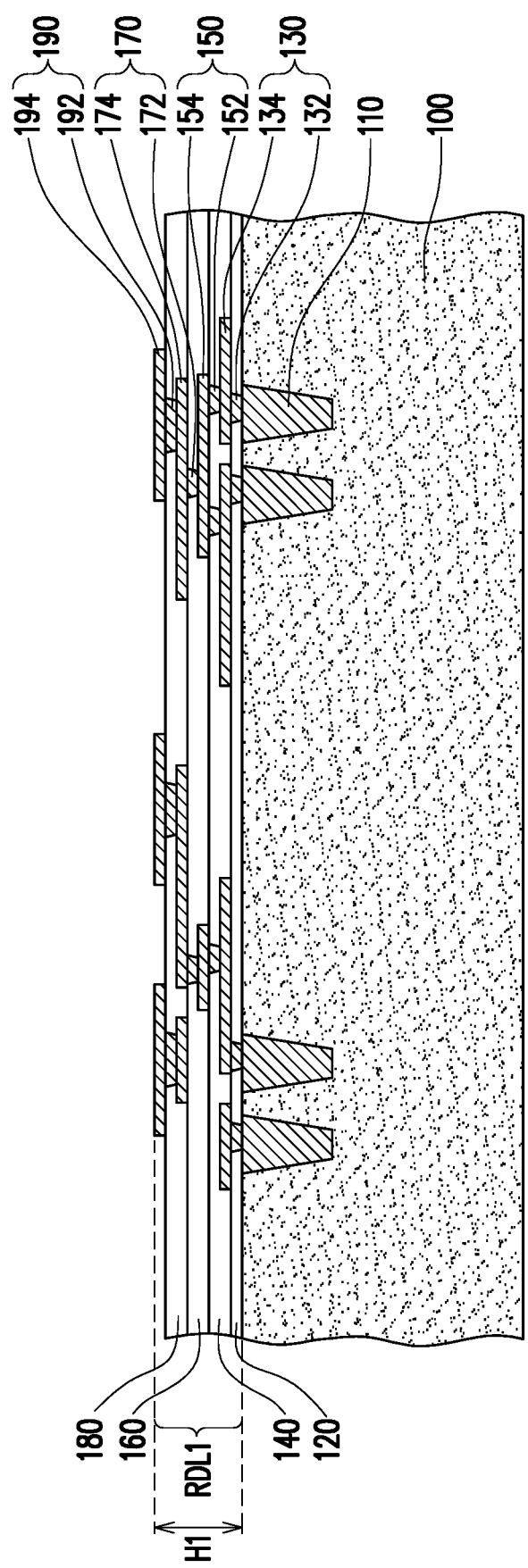

Referring to FIG. 2 and FIG. 3, a redistribution structure RDL1 electrically connected to the conductive through-vias 110 is then formed on the first surface 100a of the heat dissipation substrate 100 and the first surfaces 110a of the conductive through-vias 110. In some embodiments, the redistribution structure RDL1 may be formed by initially forming a dielectric layer 120 over the first surface 100a of heat dissipation substrate 100 and the first surfaces 110a of the conductive through-vias 110. The dielectric layer 120 may be formed by forming a dielectric material layer over the heat dissipation substrate 100 and the conductive through-vias 110 through a suitable technique such as spin coating, chemical vapor deposition (CVD), plasma-enhanced chemical vapor deposition (PECVD), lamination or the like. Thereafter, the dielectric material layer is patterned to form the dielectric layer 120 having a plurality of openings (not shown) exposing portions of the conductive through-vias 110. In some embodiments, a material of the dielectric layer 120 includes polyimide, epoxy resin, acrylic resin, phenol resin, benzocyclobutene (BCB), polybenzoxazole (PBO), or any other suitable polymer-based dielectric material. Then, a redistribution layer 130 may be formed through the dielectric layer 120 in order to make electrical connections to the conductive through-vias 110. In some embodiments, the redistribution layer 130 includes seed layers and conductive patterns formed on the seed layers (not individually shown). The seed layers may include, for example, copper, titanium-copper alloy, or other suitable choice of materials. The conductive patterns may include, for example, copper, copper alloys, or the like. In some embodiments, the redistribution layer 130 includes redistribution vias 132 and redistribution lines 134 connected to the redistribution vias 132. In some embodiments, the redistribution vias 132 are embedded in the openings of the dielectric layer 120 and the redistribution lines 134 are over the redistribution vias 132 and the dielectric layer 120. In certain embodiments, the redistribution vias 132 and the redistribution lines 134 may be formed in the same step. However, the disclosure is not limited thereto. In other embodiments, the redistribution vias 132 and the redistribution lines 134 are formed in different steps.

After the redistribution layer 130 is formed, a dielectric layer 140 may be formed on the dielectric layer 120 and the redistribution layer 130. A redistribution layer 150 including redistribution vias 152 and redistribution lines 154 may be formed through the dielectric layer 140 in order to make electrical connections to the redistribution layer 130. A dielectric layer 160 may be formed on the dielectric layer 140 and the redistribution layer 150. A redistribution layer 170 including redistribution vias 172 and redistribution lines 174 may be formed through the dielectric layer 160 in order to make electrical connections to the redistribution layer 150. A dielectric layer 180 may be formed on the dielectric layer 160 and the redistribution layer 170. A redistribution layer 190 including redistribution vias 192 and redistribution lines 194 may be formed through the dielectric layer 180 in order to make electrical connections to the redistribution layer 170. In some embodiments, the dielectric layer 140, 160 and 180, and the redistribution layer 150, 170 and 190 may be formed using the same methods and materials as the dielectric layer 120 and the redistribution layer 130 described above, and the detailed description is thus omitted herein. It is noted that the redistribution structure RDL1 illustrated herein is an example, and the numbers of the dielectric layer and the redistribution layer may not be limited by the disclosure. In some alternative embodiments, more layers of the redistribution layer and more layers of the dielectric layer may be formed depending on the circuit design. In some embodiments, the redistribution structure RDL1 may have a thickness or height H1 ranging from about 40 micrometers to about 280 micrometers.

Figure 4:
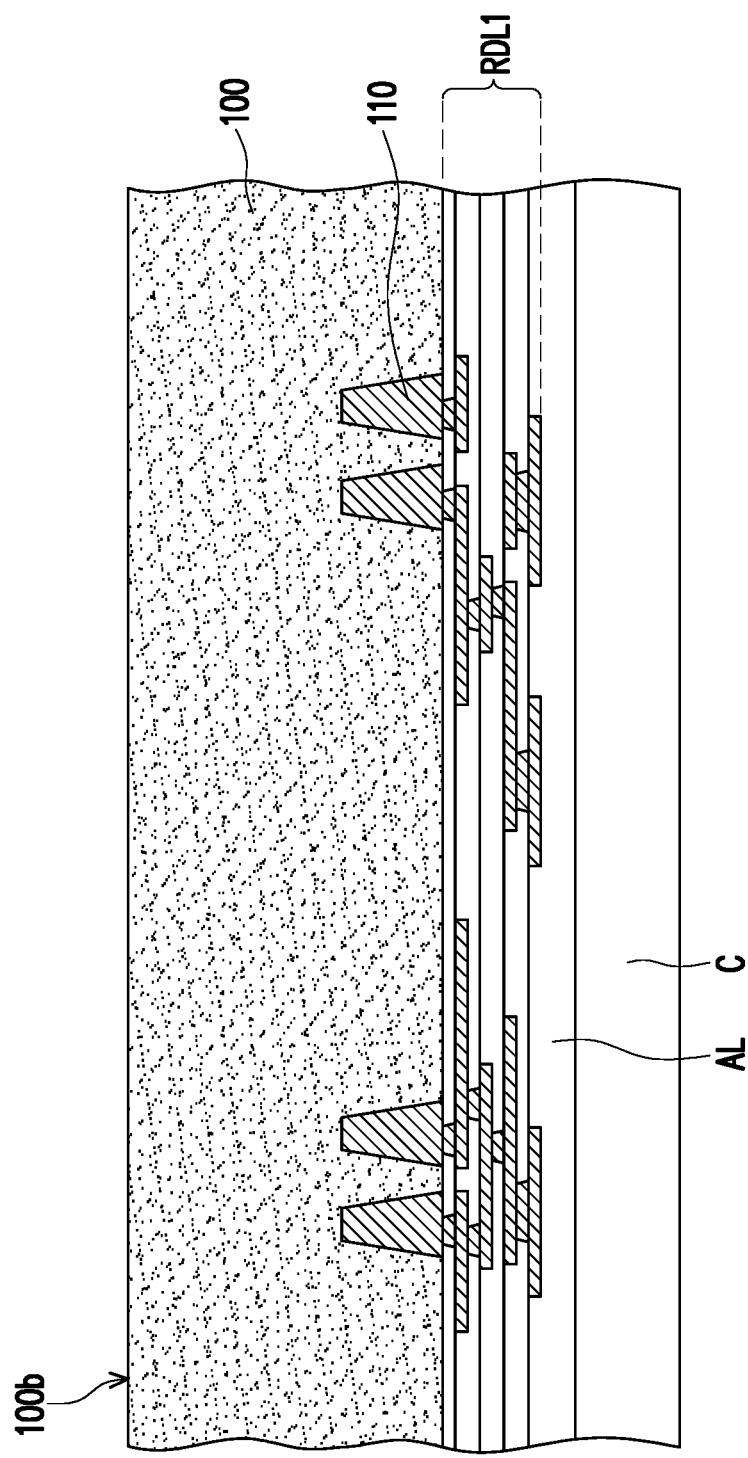

Referring to FIG. 3 and FIG. 4, after the redistribution structure RDL1 is formed, the structure in FIG. 2 may be flipped (turned upside down) for further processing and attached onto a carrier C. In some embodiments, the carrier C is a glass substrate. However, other material may be adapted as a material of the carrier C as long as the material is able to withstand the following manufacturing processes while supporting the elements formed thereon. As illustrated in FIG. 4, an adhesive material layer AL is formed between the carrier C and the redistribution structure RDL1. In some embodiments, the adhesive material layer AL may include a dielectric material layer made of an epoxy-based thermal-release material, which loses its adhesive property when heated, such as a light-to-heat-conversion (LTHC) release coating film. In alternative embodiments, the adhesive material layer AL may include a dielectric material layer made of an ultra-violet (UV) glue, which loses its adhesive property when exposed to UV lights. In certain embodiments, the adhesive material layer AL may be dispensed as a liquid and cured, or may be a laminate film laminated onto the carrier C.

Figure 5:
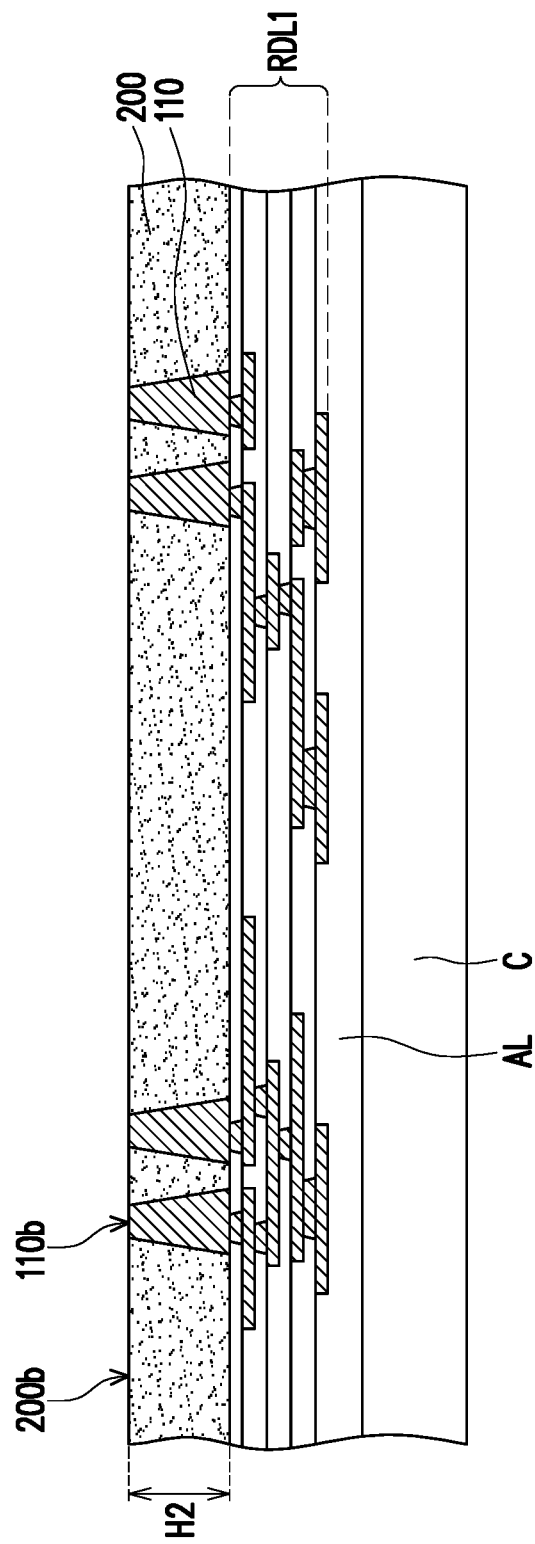

Referring to FIG. 4 and FIG. 5, the heat dissipation substrate 100 may be thinned down to remove portions of the heat dissipation substrate 100 until the second surfaces 110b of the conductive through-vias 110 are exposed. In some embodiments, a grinding process of the heat dissipation substrate 100 is performed to reduce the thickness of the heat dissipation substrate 100. In some embodiments, the second surface 100b of the heat dissipation substrate 100 which is opposite to the redistribution structure RDL1 is ground. Due to the grinding process, the heat dissipation substrate 100 may be reduced in thickness to form a thinned heat dissipation substrate 200. In some embodiments, the grinding process is a mechanical grinding process and/or a chemical mechanical polishing (CMP) process. In some embodiments, portions of the conductive through-vias 110 are slightly ground as well. However, any other suitable method of exposing the conductive through-vias 110, such as a series of one or more etching processes, may also be utilized. After the grinding process, the second surfaces 110b of the conductive through-vias 110 may be substantially coplanar with the second surface 200b of the thinned heat dissipation substrate 200. However, in some alternative embodiments, the second surfaces 110b of the conductive through-vias 110 may slightly higher or lower than the top surface 200a of the thinned heat dissipation substrate 200. In some embodiments, the thinned heat dissipation substrate 200 and/or the conductive through-vias 110 may have a thickness or height H2 ranging from about 20 micrometers to about 500 micrometers.

Figure 6:
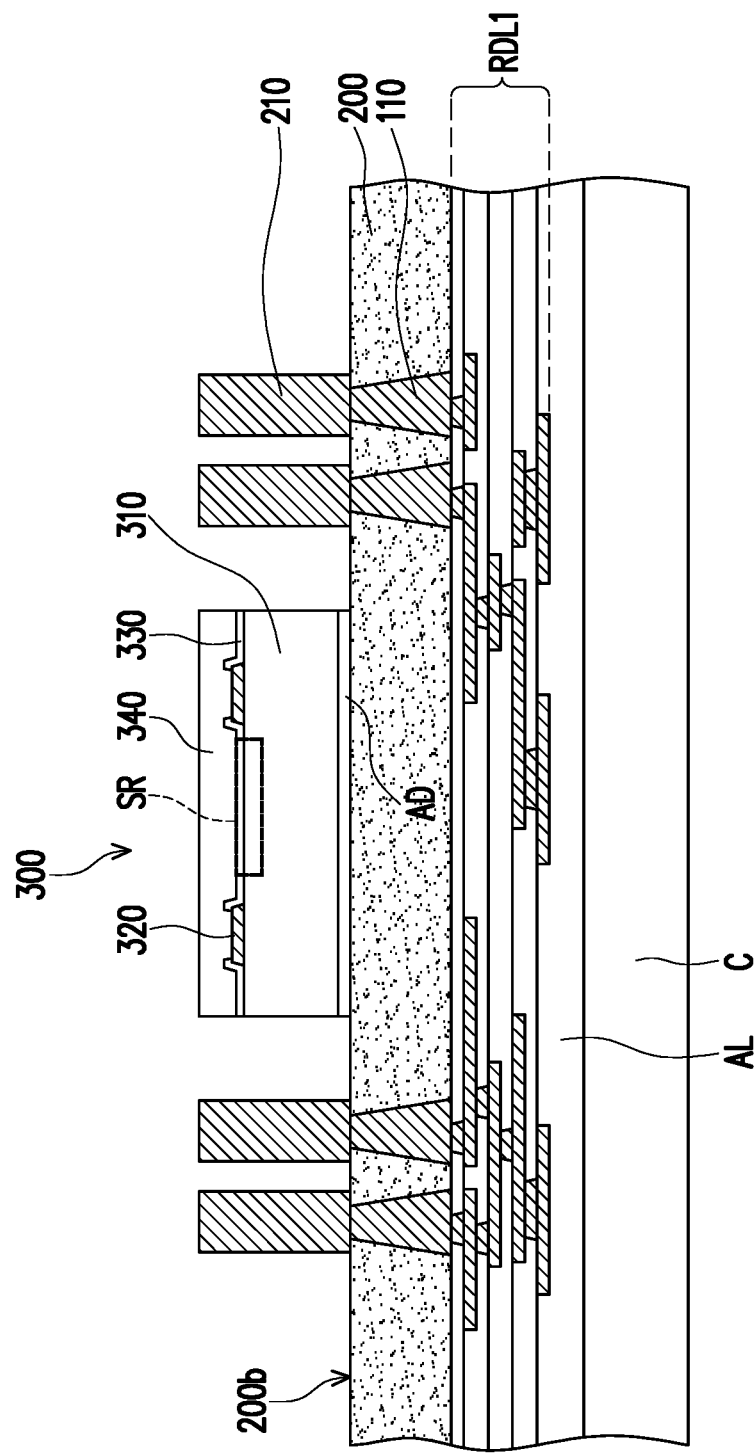

Referring to FIG. 5 and FIG. 6, a plurality of conductive through-vias 210 are formed on the heat dissipation substrate 200. In some embodiments, the conductive through-vias 210 are formed on and electrically connected to the conductive through-vias 110, and further electrically connected to the redistribution structure RDL1 through the conductive through-vias 110 in the heat dissipation substrate 200. In some embodiments, the conductive through-vias 210 are substantially aligned with and/or in contact with the conductive through-vias 110. The material of the conductive through-vias 210 may be the same as or different from the material of the conductive through-vias 110.

In some embodiments, the method of forming the conductive through-vias 210 includes the following steps. First, a seed material layer (not shown) is formed over the heat dissipation substrate 200. In some embodiments, the seed material layer is blanketly formed over and is in direct contact with the heat dissipation substrate 200 and the conductive through-vias 110. The seed material layer may be formed through, for example, a sputtering process, a physical vapor deposition (PVD) process, or the like. In some embodiments, the seed material layer may include, for example, copper, titanium-copper alloy, or other suitable choice of materials. Then, a photoresist layer (not shown) having a plurality of openings exposing at least a portion of the seed material layer is formed over the seed material layer. Then, a conductive material (not shown) is filled into the openings of the photoresist layer and the photoresist layer is removed, so as to form a plurality of conductive patterns on the seed material layer. Upon removal of the photoresist layer, portions of the seed material layer, which are not covered by the conductive patterns, are exposed. In some embodiments, the conductive material may be formed by a plating process. The plating process is, for example, electro-plating, electroless-plating, immersion plating, or the like. In some embodiments, the conductive material includes, for example, copper, copper alloys, or the like. The photoresist pattern layer may be removed/stripped through, for example, etching, ashing, or other suitable removal processes. Then, the seed material layer that is not covered by the conductive patterns is removed to render seed layers. The exposed portions of the seed material layer may be removed through an etching process. In some embodiments, the conductive patterns and the seed layers are collectively referred to as the conductive through-vias 210. However, the disclosure is not limited thereto. For example, in some alternative embodiments, the conductive through-vias 210 may be pre-fabricated through-vias and are provided by pick and place onto the corresponding conductive through-vias 110.

Still referring to FIG. 6, a sensor die 300 is provided over the heat dissipation substrate 200 by, for example, a pick and place process. In some embodiments, the sensor die 300 is attached to the heat dissipation substrate 200 through an adhesive layer AD between the sensor die 300 and the heat dissipation substrate 200. In some embodiments, the adhesive layer AD includes a die attach film (DAF), a thermal interface material (TIM), or the like. In some embodiments, the active surface of the sensor die 300 faces upward. In some embodiments, the sensor die 300 is disposed between the conductive through-vias 210. In other words, the conductive through-vias 210 are aside or around the sensor die 300. In some embodiments, the sensor die 300 may include one or more sensors, integrated circuits, logic circuits (e.g., central processing units, microcontrollers, etc.), memory (e.g., dynamic random access memory (DRAM), static random access memory (SRAM), etc.), power management circuits (e.g., power management integrated circuits (PMIC)), radio frequency (RF) components, micro-electro-mechanical-system (MEMS) components, signal processing circuits (e.g., digital signal processing (DSP) circuits), front-end circuits (e.g., analog front-end (AFE) circuits), the like, or a combination thereof. In some embodiments, in FIG. 6, one sensor die 300 is shown, but the number of the sensor die 300 is not limited to be one but can be more than one.

The sensor die 300, for example, includes a semiconductor substrate 310, a plurality of conductive pads 320 and a passivation layer 330. In some embodiments, the semiconductor substrate 310 is made of silicon or other semiconductor materials. Alternatively or additionally, the semiconductor substrate 310 includes other elementary semiconductor materials such as germanium, gallium arsenic, or other suitable semiconductor materials. In some embodiments, the semiconductor substrate 310 may further include other features such as various doped regions, a buried layer, and/or an epitaxy layer. Moreover, in some embodiments, the semiconductor substrate 310 is made of an alloy semiconductor such as silicon germanium, silicon germanium carbide, gallium arsenic phosphide, or gallium indium phosphide. Furthermore, the semiconductor substrate 310 may be a semiconductor on insulator such as silicon on insulator (SOI) or silicon on sapphire. In some embodiments, a plurality of devices (not shown) are formed in or on the semiconductor substrate 310. The devices may be active devices, passive devices, or combinations thereof. In some embodiments, the devices are integrated circuit (IC) devices. The devices are, for example, transistors, capacitors, resistors, diodes, photodiodes, fuse devices, or the like, or combinations thereof.

In some embodiments, the conductive pads 320 are on the active surface of the sensor dies 300 and are electrically connected to the devices formed in or on the semiconductor substrate 310. The material of the conductive pads 320 may be aluminum pads, copper pads, or other suitable metal pads. In some embodiments, the passivation layer 330 is formed over the semiconductor substrate 310 and has contact openings that partially expose the conductive pads 320. Portions of the conductive pads 320 are exposed by the passivation layer 330 and serves as an external connection of the sensor die 300. In some embodiments, the passivation layer 330 may be a silicon oxide layer, a silicon nitride layer, a silicon oxy-nitride layer, or a dielectric layer formed by other suitable dielectric materials. In some embodiments, the sensor die 300 includes a sensor region SR in which a sensor is formed. The sensor region SR may extend from the top surface of the passivation layer 330 to the device layer in or on the semiconductor substrate 310, but the disclosure is not limited thereto.

As illustrated in FIG. 6, the sensor die 300 may further include a sacrificial layer 340 over the semiconductor substrate 310 and covering the conductive pads 320 and the passivation layer 330. That is, the sensor region SR of the sensor die 300 are covered by the sacrificial layer 340. In some embodiments, the material of the sacrificial layer 340 is different from the materials of the passivation layer 330 and the subsequently formed insulating encapsulant 400. For example, the sacrificial layer 340 may include a polymer such as polybenzoxazole (PBO), polyimide (PI), benzocyclobutene (BCB), a combination thereof, or the like, but the disclosure is not limited thereto. In some embodiments, the sensor die 300 is free of a connector on the conductive pads 320, but the disclosure is not limited thereto. In some embodiments, a top surface of the sacrificial layer 340 is substantially level with the top surfaces of the conductive through-vias 210. In some embodiments, a top surface of the sacrificial layer 340 is higher or lower than the top surfaces of the conductive through-vias 210.

Figure 7:
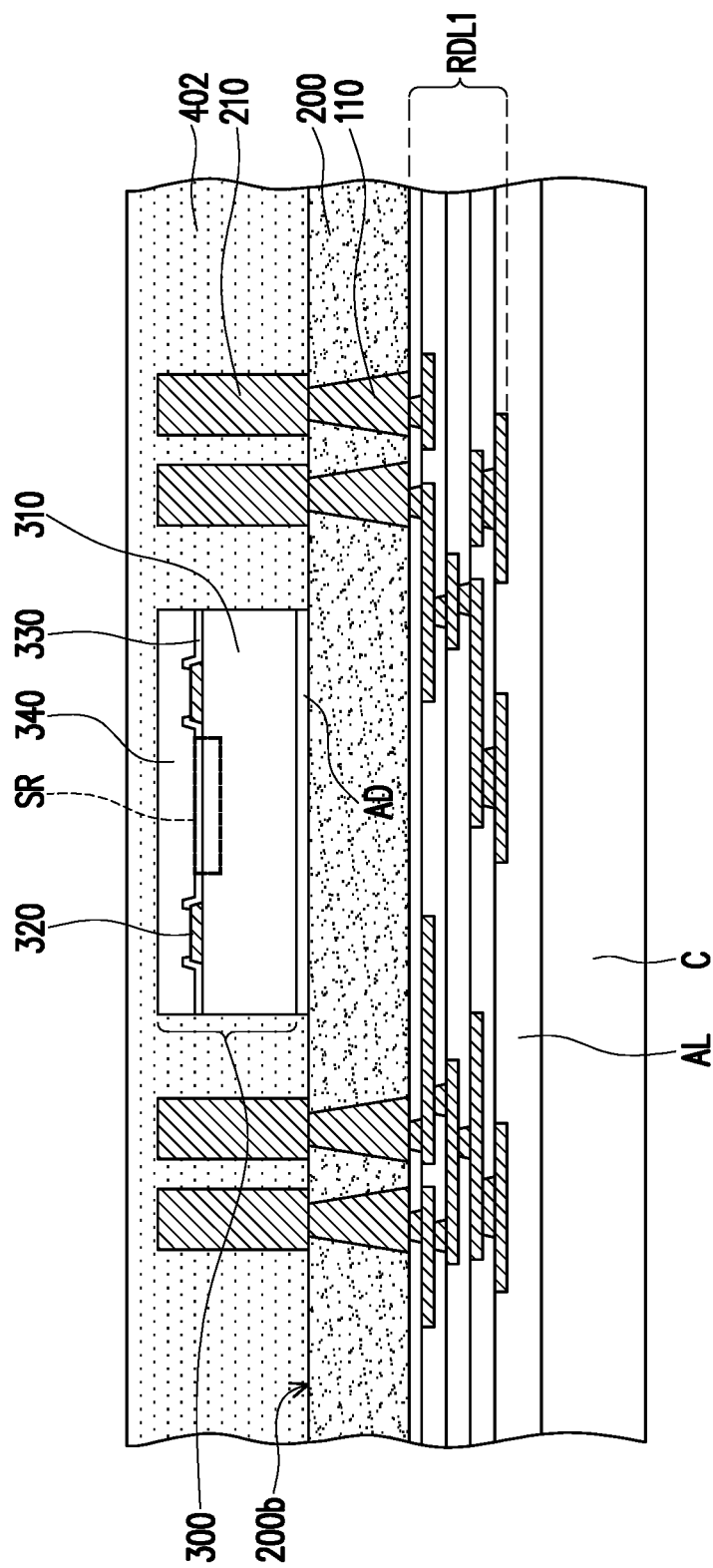

Referring to FIG. 6 and FIG. 7, an encapsulation material 402 is formed over the heat dissipation substrate 200 to encapsulate the conductive through-vias 210 and the sensor die 300. The conductive through-vias 210 and the sensor die 300 may not be revealed and may be well protected by the encapsulation material 402. In some embodiments, the encapsulation material 402 is a molding compound, a molding underfill, a resin (such as epoxy), or the like. The encapsulation material 402 may be formed by a molding process. For example, the encapsulation material 402 may be formed by a compression molding process, a transfer molding process, or the like. A curing process is optionally performed to harden the encapsulation material 402 for optimum protection. In some embodiments, the encapsulation material 402 includes a base material and filler particles distributed in the base material. In some embodiments, the material of the base material includes epoxy resins, phenolic resins or silicon-containing resins, or the like, and the material of the filler particles includes silica, alumina, zinc oxide, titanium dioxide, or the like.

Figure 8:
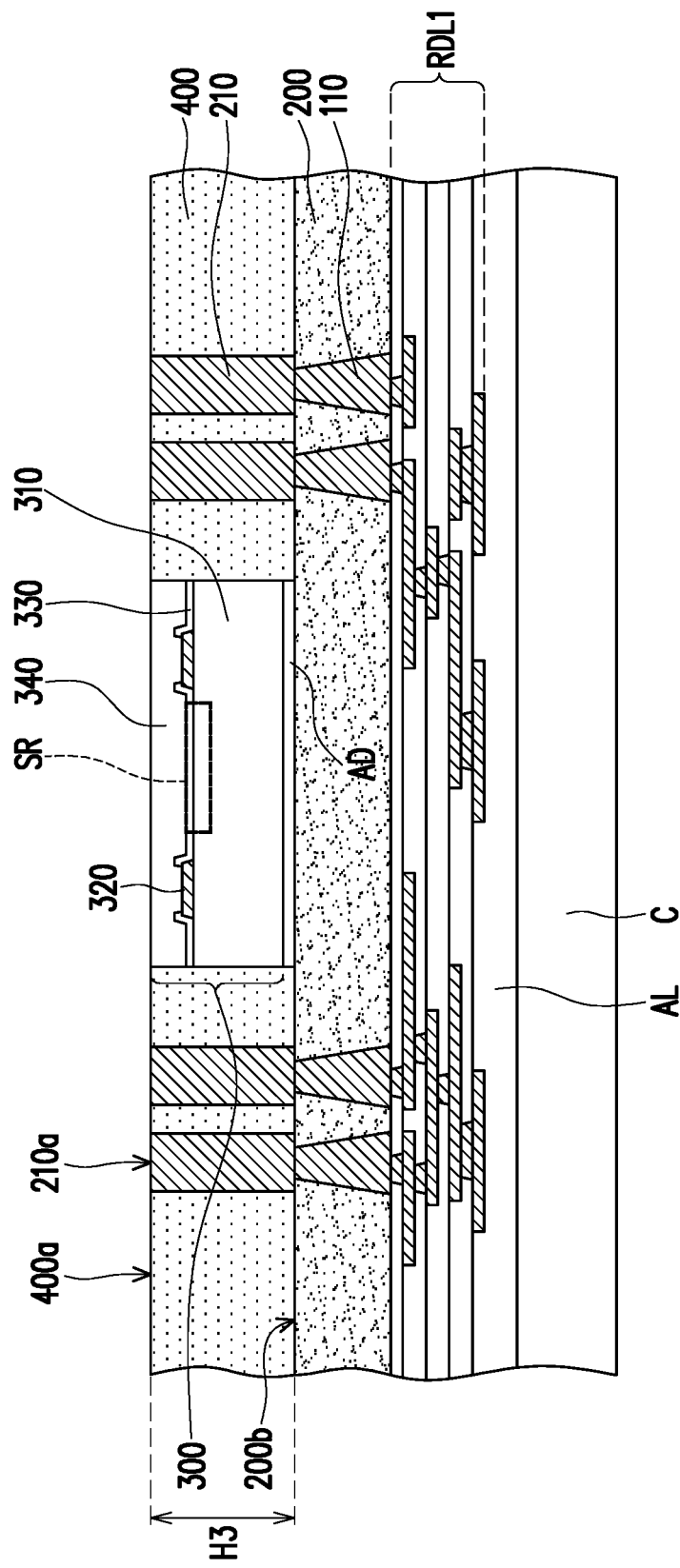

Referring to FIG. 7 and FIG. 8, a planarization process is performed on the encapsulation material 402 to remove portions of the encapsulation material 402, until the conductive through-vias 210 and sacrificial layer 340 are exposed. Due to the planarization, the encapsulation material 402 may be reduced in thickness to form an insulating encapsulant 400. The insulating encapsulant 400 is formed over the heat dissipation substrate 200 to laterally encapsulate the conductive through-vias 210 and the sensor die 300. In some embodiments, the insulating encapsulant 400 is in contact with the heat dissipation substrate 200. In some embodiments, the planarization process is a mechanical grinding process and/or a chemical mechanical polishing (CMP) process. In some embodiments, portions of the conductive through-vias 210 and/or sacrificial layer 340 are slightly grinded as well. After the planarization process, the top surface 210a of the conductive through-vias 210 and the top surface of the sacrificial layer 340 are substantially coplanar with a top surface 400a of the insulating encapsulant 400. In some embodiments, the conductive through-vias 210 may have a thickness or height H3 ranging from about 40 micrometers to about 700 micrometers.

Figure 9:
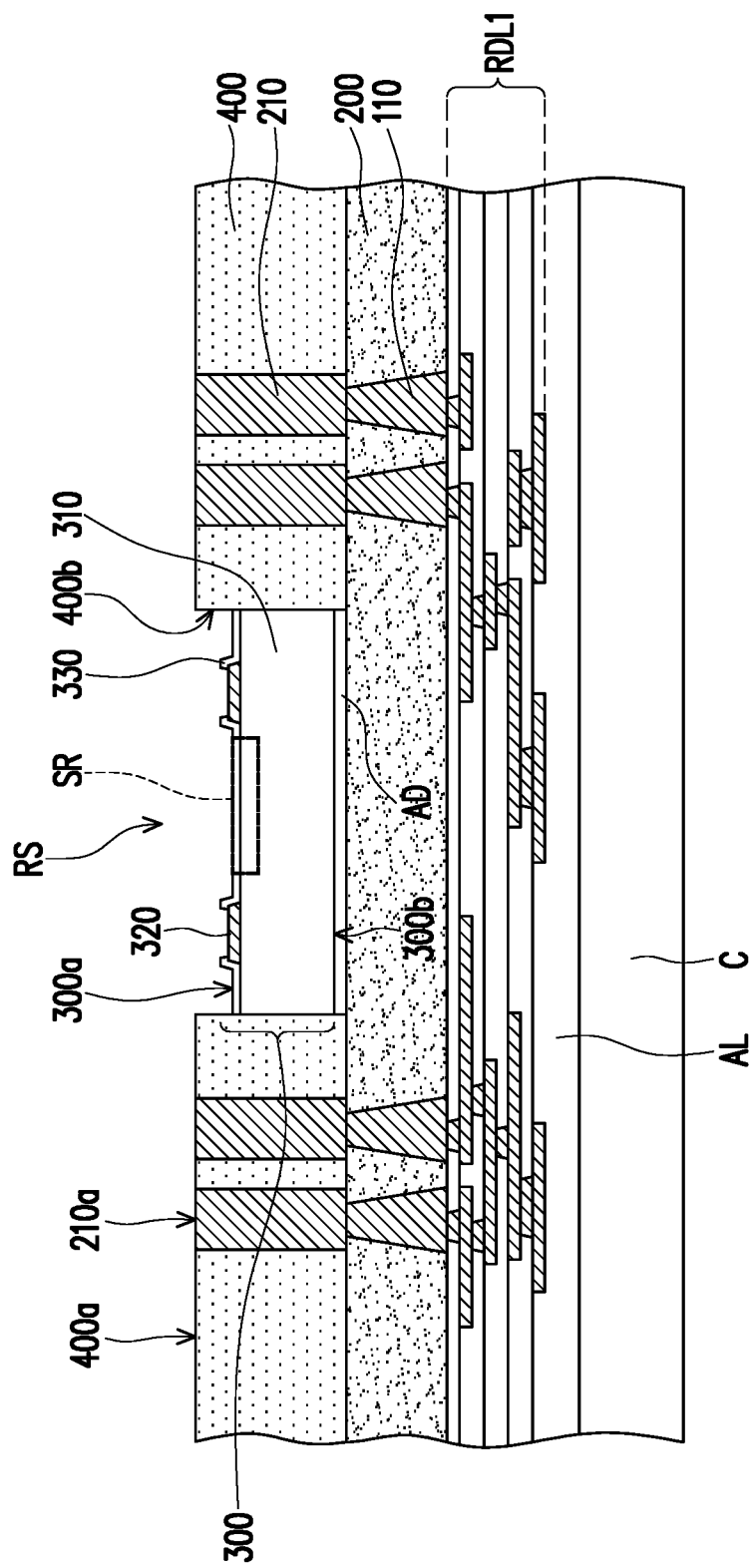

Referring to FIG. 8 and FIG. 9, the sacrificial layer 340 is removed to expose the conductive pads 320, the passivation layer 330 and the sensing region SR of the sensor die 300, and a recess RS is formed in the insulating encapsulant 400. The sacrificial layer 340 may be removed by a suitable technique such as an etching process, a laser irradiation process, or the like. In some embodiments, the etching process may include dry etching, wet etching or a combination thereof. As illustrated in FIG. 9, after the sacrificial layer 340 is removed, a portion of inner sidewall 400b of the insulating encapsulant 400 is exposed, and top surfaces of the conductive pads 320 and a top surface of the passivation layer 330 are also exposed. In some embodiments, the top surfaces of the conductive pads 320 and the top surface of the passivation layer 330 constitute a front surface 300a of the sensor die 300 which is opposite to a rear surface 300b of the sensor die 300. In some embodiments, the front surface 300a is referred to as the active surface of the sensor die 300. In some embodiments, the front surface 300a of the sensor die 300 is lower than the top surface 210a of the conductive through-vias 210 and the top surface 400a of the insulating encapsulant 400.

Figure 10:
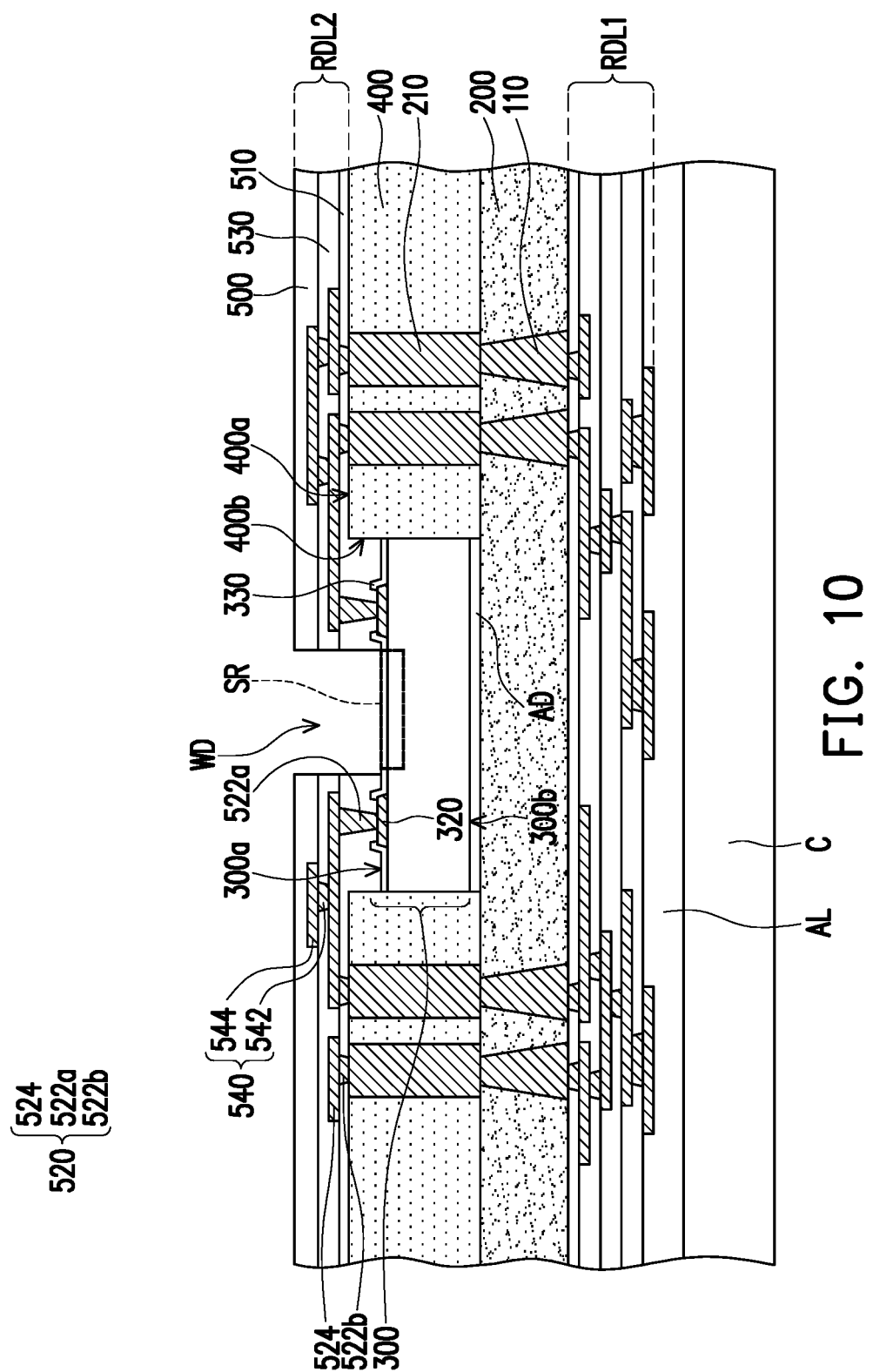

Referring to FIG. 9 and FIG. 10, a redistribution structure RDL2 electrically connected to conductive through-vias 210 and the sensor die 300 is then formed on the conductive through-vias 210, the sensor die 300 and the insulating encapsulant 400. In some embodiments, the redistribution structure RDL2 may be formed by initially forming a dielectric layer 510 over the conductive through-vias 210, the sensor die 300 and the insulating encapsulant 400. The dielectric layer 510 may be formed by forming a dielectric material layer over the conductive through-vias 210, the sensor die 300 and the insulating encapsulant 400 through a suitable technique such as spin coating, chemical vapor deposition (CVD), plasma-enhanced chemical vapor deposition (PECVD), lamination or the like. Thereafter, the dielectric material layer is patterned to form the dielectric layer 510 having a plurality of openings (not shown) exposing the conductive through-vias 210 and the conductive pads 320 of the sensor die 300. In some embodiments, a material of the dielectric layer 510 includes polyimide, epoxy resin, acrylic resin, phenol resin, benzocyclobutene (BCB), polybenzoxazole (PBO), or any other suitable polymer-based dielectric material. Then, a redistribution layer 520 may be formed through the dielectric layer 510 in order to make electrical connections to the conductive through-vias 210 and the conductive pads 320 of the sensor die 300. In some embodiments, the redistribution layer 520 includes seed layers and conductive patterns formed on the seed layers (not individually shown). The seed layers may include, for example, copper, titanium-copper alloy, or other suitable choice of materials. The conductive patterns may include, for example, copper, copper alloys, or the like. In some embodiments, the redistribution layer 520 includes redistribution vias 552a, 522b and redistribution lines 524 connected to the redistribution vias 522a, 522b. In some embodiments, the redistribution vias 522a, 522b are embedded in the openings of the dielectric layer 510 and the redistribution lines 524 are over the redistribution vias 522a, 522b and the dielectric layer 510. In certain embodiments, the redistribution vias 522a, 522b and the redistribution lines 524 may be formed in the same step. However, the disclosure is not limited thereto. In other embodiments, the redistribution vias 522a, 522b and the redistribution lines 524 are formed in different steps.

In some embodiments, the redistribution vias 522a penetrate through the dielectric layer 510 and are electrically connected to the conductive pads 320 of the sensor die 300. In some embodiments, the redistribution vias 522b penetrate through the dielectric layer 510 and are electrically connected to the conductive through-vias 210. In some embodiments, the sensor die 300 is electrically connected to the conductive through-vias 210 through the redistribution vias 522a, redistribution lines 524 and the redistribution vias 522b. In some embodiments, the height of the redistribution vias 522a is higher than the height of the redistribution vias 522b, and the bottom surfaces of the redistribution vias 522b are lower than the bottom surface of the redistribution vias 522b. In some embodiments, the redistribution vias 522a, 522b have tapered sidewalls, wherein the width of the redistribution vias 522a is gradually decreased from a side connected to the redistribution lines 524 to a side in contact with the conductive pads 320 of the sensor die 300, and the width of the redistribution vias 522b is gradually decreased from a side connected to the redistribution lines 524 to a side in contact with the conductive through-vias 210.

After the redistribution layer 520 is formed, a dielectric layer 530 may be formed on the dielectric layer 510 and the redistribution layer 520. A redistribution layer 540 including redistribution vias 542 and redistribution lines 544 may be formed through the dielectric layer 530 in order to make electrical connections to the redistribution layer 520. A dielectric layer 550 may be formed on the dielectric layer 530 and the redistribution layer 540. In some embodiments, the dielectric layer 530 and 550 and the redistribution layer 540 may be formed using the same methods and materials as the dielectric layer 510 and the redistribution layer 520 described above, and the detailed description is thus omitted herein. It is noted that the redistribution structure RDL2 illustrated herein is an example, and the numbers of the dielectric layer and the redistribution layer may not be limited by the disclosure. In some alternative embodiments, more layers of the redistribution layer and more layers of the dielectric layer may be formed depending on the circuit design.

In some embodiments, the redistribution structure RDL2 is referred to as a "front-side redistribution structure" formed over a front side of the sensor die 300. In some embodiments, the redistribution structure RDL1 is referred to as a "back-side redistribution structure" formed over a back side of the sensor die 300. Through the specification, wherein the "front-side" refers to a side close to the front surface 300a of the sensor die 300, and the "back-side" refers to a side close to the rear surface 300b of the sensor die 300. In some embodiments, the back-side redistribution structure (i.e., the redistribution structure RDL1) is electrically connected to the sensor die 300 through the conductive through-vias 110, the conductive through-vias 210 and the front-side redistribution structure (i.e., the redistribution structure RDL2).

Still referring to FIG. 10, after the redistribution structure RDL2 is formed, the redistribution structure RDL2 may be patterned to form a window WD exposing the sensing region SR of the sensor die 300. The patterning method may include exposure and development processes, a laser drilling process, or the like, or a combination thereof. The window WD extends through the dielectric layers 510, 530 and 550 of the redistribution structure RDL2. In some embodiments, an air gap is over the sensing region SR, and the air gap is laterally disposed between portions of the redistribution structure RDL2. In some embodiments, the window WD exposes the sensing region SR of the sensor die 30, allowing the sensing region SR receiving light to perform sensing functions.

In the embodiment described above, the window WD may be formed after formation of the redistribution structure RDL2. However, in alternative embodiments, the window WD may be formed during formation of the redistribution structure RDL2. For example, when the openings of the dielectric layer 510 or 530 for electrical connections are formed, a window exposing the sensing region SR may be formed simultaneously.

As illustrated in FIG. 10, the dielectric layer 510 is disposed on the insulating encapsulant 400 and partially fills into the recess RS (in FIG. 9). The dielectric layer 510 may cover the top surface 400a of the insulating encapsulant 400, a portion of the inner sidewalls 400b of the insulating encapsulant 400 and a portion of the front surface 300a of the sensor die 300. In some embodiments, the top surfaces of the conductive pads 320 and a peripheral portion of the top surface of the passivation layer 330 are covered by the dielectric layer 510, and a central portion of the top surface of the passivation layer 330 is exposed by the dielectric layer 510.

Figure 11:
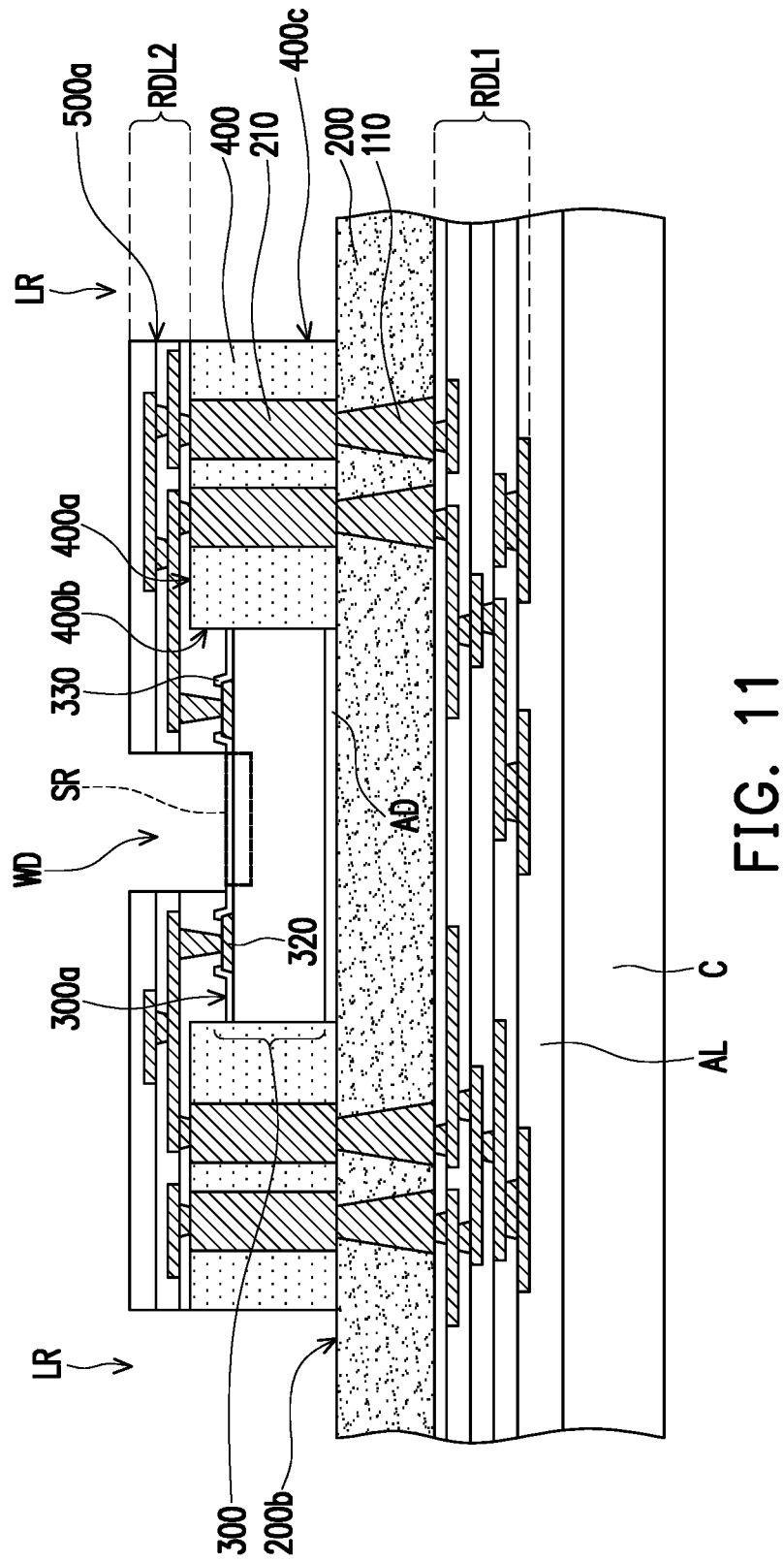

Referring to FIG. 10 and FIG. 11, a removal process is performed to remove peripheral portions of the redistribution structure RDL2 and the insulating encapsulant 400, so as to expose a portion of the heat dissipation substrate 200. In some embodiments, a peripheral portion of the second surface 200b of heat dissipation substrate 200 is exposed to form a landing region LR for landing, for example, a heat dissipation frame. In some embodiments, the removal process includes a laser process. In other embodiments, the removal process includes one or more etching process. In some embodiments, the peripheral portions of the redistribution structure RDL2 and the insulating encapsulant 400 are removed such that the heat dissipation substrate 200 extends beyond lateral extents of the insulating encapsulant 400 and the redistribution structure RDL2. In some embodiments, outer sidewalls 500a of the redistribution structure RDL2 and outer sidewalls 400c of the insulating encapsulant 400 are vertical sidewalls, and the outer sidewalls 500a of the redistribution structure RDL2 are substantially aligned with the outer sidewalls 400c of the insulating encapsulant 400. However, in some alternative embodiments, the outer sidewalls 500a of the redistribution structure RDL2 and outer sidewalls 400c of the insulating encapsulant 400 may be inclined sidewalls.

Figure 12:
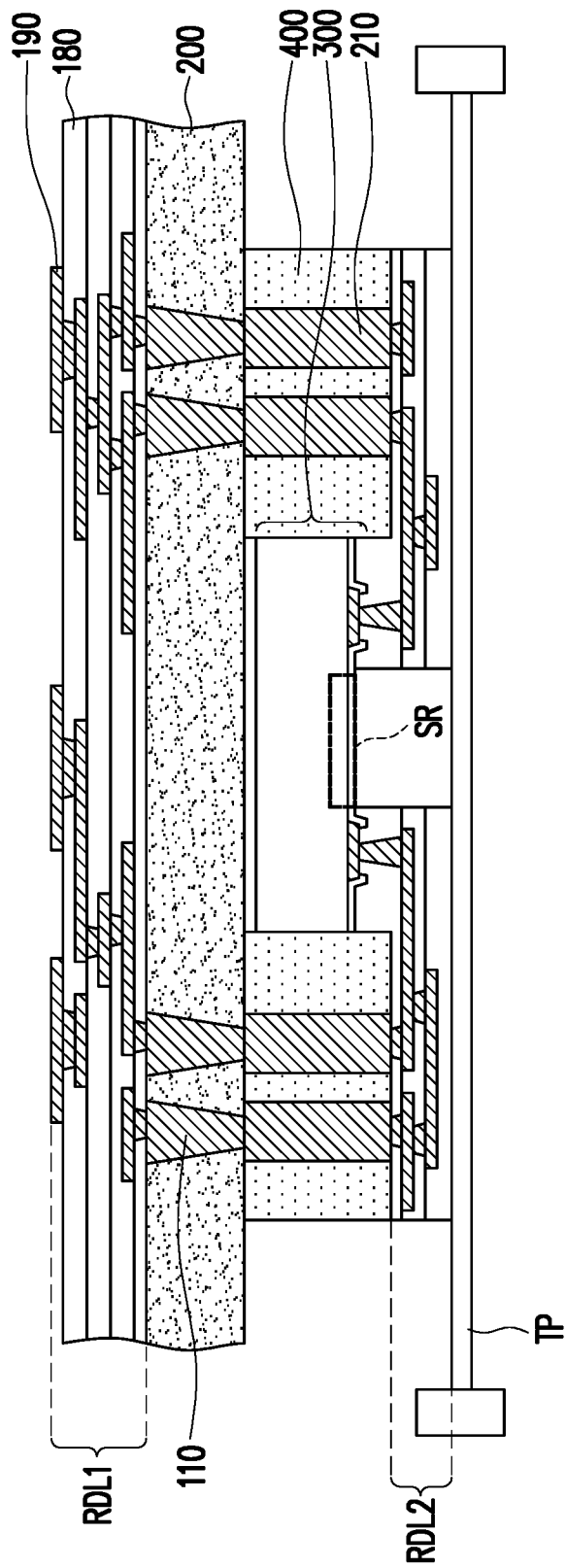

Referring to FIG. 11 and FIG. 12, the structure in FIG. 11 is flipped upside down and is placed on a tape TP, and the carrier C is de-bonded or removed from the resulting structure. In some embodiments, the adhesive material layer AL may be irradiated by an UV laser such that the carrier C and the adhesive material layer AL may be peeled off. Nevertheless, the de-bonding process is not limited thereto. Other suitable de-carrier methods may be used in some alternative embodiments. In some embodiments, after the carrier C and the adhesive material layer AL are removed, the redistribution layer 190 of the redistribution structure RDL1 are exposed.

Figure 13:
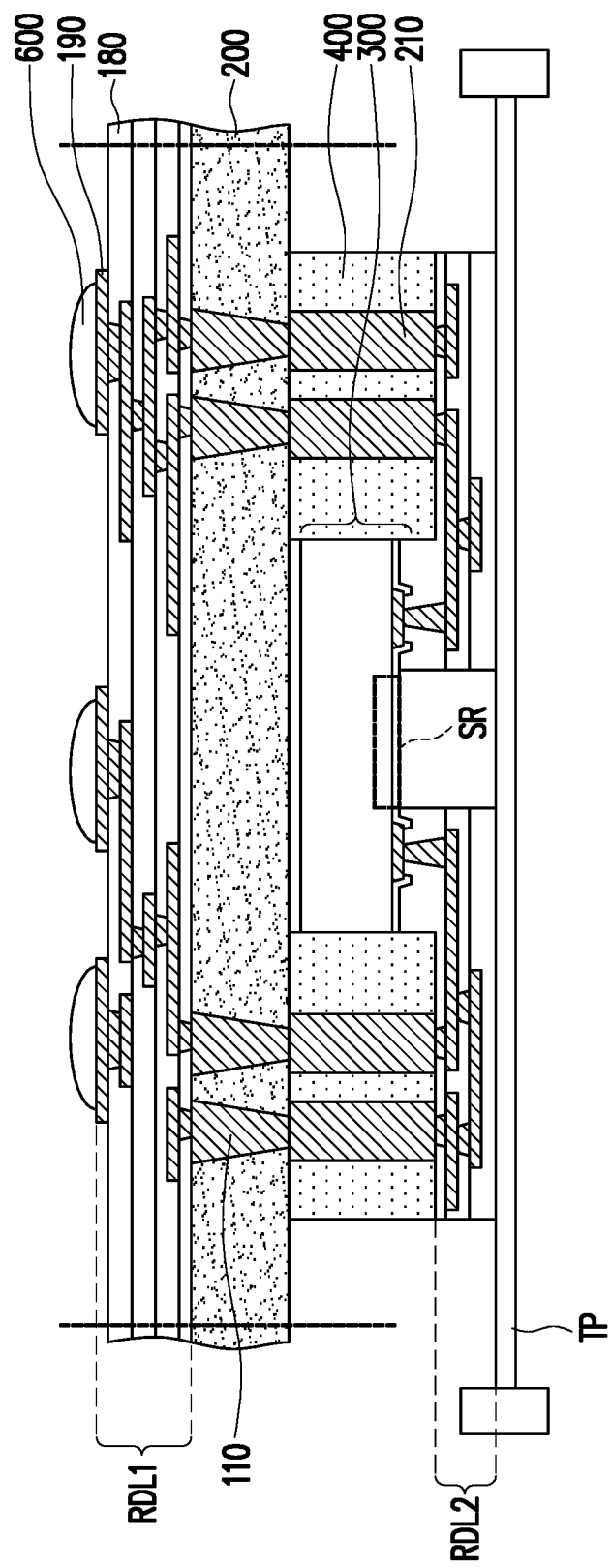

Referring to FIG. 12 and FIG. 13, in some embodiments, the topmost one of the redistribution layer (e.g., redistribution layer 190) includes a part (e.g., under-ball metallurgy (UBM) patterns) for electrically connecting with the later-formed components. In some embodiments, after the carrier C and the adhesive material layer AL is removed, a plurality of conductive terminals 600 are formed on the UBM patterns of the redistribution layer 190 by a ball placement process, a plating process, or other suitable processes. In some embodiments, the conductive terminals 600 are electrically coupled to the sensor die 300 through the redistribution structure RDL1, the conductive through-vias 110, the conductive through-vias 210 and the redistribution structure RDL2. For example, the conductive terminals 600 include controlled collapse chip connection (C4) bumps, microbumps, solder balls, ball grid array (BGA) balls, or other suitable terminals for providing external connections to the sensor die 300. Other possible forms and shapes of the conductive terminals 600 may be utilized according to design requirements. In some embodiments, a soldering process and a reflow process are optionally performed for enhancement of the adhesion between the conductive terminals 600 and the redistribution structure RDL1.

Figure 14:
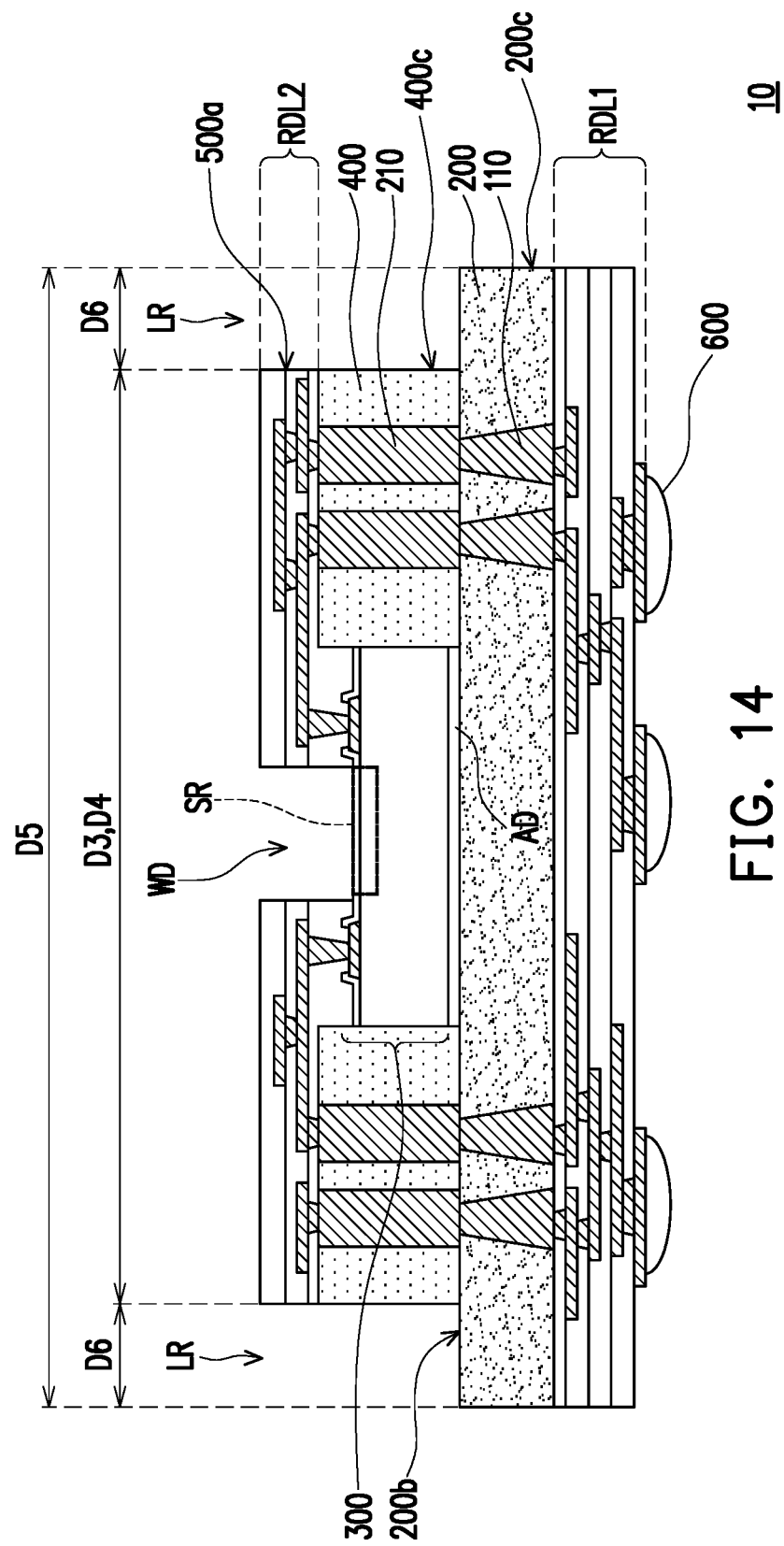

Referring to FIG. 13 and FIG. 14, after the conductive terminals 600 are formed, the structure is diced or singulated. Thereafter, the diced structure is removed from the tape TP to form a plurality of semiconductor packages 10. In some embodiments, the dicing process or the singulation process typically involves dicing with a rotating blade or a laser beam. In other words, the dicing or singulation process is, for example, a laser cutting process, a mechanical cutting process, or other suitable processes. Up to here, the fabrication of the semiconductor package 10 is substantially complete.

In some embodiments, after the fabrication of the semiconductor package 10 is substantially complete, the aforementioned heat dissipation frame is mounted on the landing region LR of the heat dissipation substrate 200 and is in contact with the exposed second surface 200b of the heat dissipation substrate 200. In some embodiments, the heat dissipation frame is not in contact with the outer sidewalls 400c of the insulating encapsulant 400 and the outer sidewalls 500a of the redistribution structures RDL2. In other words, a gap (not shown) is between the heat dissipation frame and the insulating encapsulant 400 and the redistribution structures RDL2.

As illustrated in FIG. 14, the semiconductor package 10 may include the heat dissipation substrate 200, the sensor die 300, the insulating encapsulant 400, the conductive through-vias 110 and 210, and the redistribution structures RDL1 and RDL2. The conductive through-vias 110 may be embedded in the heat dissipation substrate 200. The sensor die 300 may be disposed on the heat dissipation substrate 200. The insulating encapsulant 400 may partially cover the heat dissipation substrate 200 and laterally encapsulate the sensor die 300 and the conductive through-vias 210. The redistribution structures RDL1 and the redistribution structures RDL2 may be disposed on opposite sides of the heat dissipation substrate 200. In some embodiments, the insulating encapsulant 400 is in contact with the heat dissipation substrate 200. In some embodiments, the conductive through-vias 110 are in contact with the conductive through-vias 210. In other words, the interfaces between the conductive through-vias 110 and the conductive through-vias 210 are solder-free, which may help to reduce the distance between the sensor die 300 and the heat dissipation substrate 200 and may help to reduce the total thickness of the semiconductor package 10.

In some embodiments, since the peripheral portions of the redistribution structure RDL2 and the insulating encapsulant 400 are removed, a width D3 of the redistribution structure RDL2 and a width D4 of the insulating encapsulant 400 are less than a width D5 of the heat dissipation substrate 200. In some embodiments, the width D3 of the redistribution structure RDL2 is substantially equal to the width D4 of the insulating encapsulant 400. In some embodiments, the outer sidewalls 500a of the redistribution structures RDL2 and the outer sidewalls 400c of the insulating encapsulant 400 may be offset from the outer sidewalls 200c of the heat dissipation substrate 200 by a width D6 that is greater than 0.5 mm, such as about 2 mm.

In some embodiments, since the heat dissipation substrate 200 is integrated in the semiconductor package 10 and is disposed in close proximity to the sensor die 300, the heat dissipation efficiency of the semiconductor package 10 may be improved, and the sensor die 300 embedded in the semiconductor package 10 may be maintained at a suitable operation temperature.

In accordance with some embodiments of the disclosure, a semiconductor package includes a heat dissipation substrate including a first conductive through-via embedded therein; a sensor die disposed on the heat dissipation substrate; an insulating encapsulant laterally encapsulating the sensor die; a second conductive through-via penetrating through the insulating encapsulant; and a first redistribution structure and a second redistribution structure disposed on opposite sides of the heat dissipation substrate. The second conductive through-via is in contact with the first conductive through-via. The sensor die is located between the second redistribution structure and the heat dissipation substrate. The second redistribution structure has a window allowing a sensing region of the sensor die receiving light. The first redistribution structure is electrically connected to the sensor die through the first conductive through-via, the second conductive through-via and the second redistribution structure.

In accordance with some embodiments of the disclosure, a semiconductor package includes a heat dissipation substrate comprising a first conductive through-via embedded therein; a sensor die and a second conductive through-via on a first surface of the heat dissipation substrate; an insulating encapsulant laterally encapsulating the sensor die and the second conductive through-via; a second conductive through-via penetrating through the insulating encapsulant; a front-side redistribution structure on the sensor die, the insulating encapsulant and the second conductive through-via; and a back-side redistribution structure on a second surface of the heat dissipation substrate opposite to the first surface. The insulating encapsulant is in contact with the first surface of the heat dissipation substrate. The front-side redistribution structure has a window allowing a sensing region of the sensor die receiving light. The back-side redistribution structure is electrically connected to the sensor die through the first conductive through-via, the second conductive through-via and the front-side redistribution structure.

In accordance with some embodiments of the disclosure, a method of forming a semiconductor package includes the following steps. A first conductive through-via is formed in a heat dissipation substrate. A first redistribution structure is formed on the heat dissipation substrate, wherein the first redistribution structure covers a first surface of the first conductive through-via and is electrically connected to the first conductive through-via. The heat dissipation substrate is thinned to expose a second surface of the first conductive through-via opposite to the first surface, so as to form a thinned heat dissipation substrate. A second conductive through-via is formed on the thinned heat dissipation substrate, wherein the second conductive through-via is electrically connected to the first redistribution structure through the first conductive through-via. A sensor die is provided on the thinned heat dissipation substrate. The second conductive through-via and the sensor die are laterally encapsulated with an insulating encapsulant. A second redistribution structure is formed on the insulating encapsulant, the sensor die and the second conductive through-via. A window extending through the second redistribution structure is formed to reveal a sensing region of the sensor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a substrate comprising a first conductive through-via, and the first conductive through-via penetrating through the substrate;
   a sensor die disposed on the substrate;
   an insulating encapsulant laterally encapsulating the sensor die;
   a second conductive through-via penetrating through the insulating encapsulant, wherein the second conductive through-via is in contact with the first conductive through-via; and
   a first redistribution structure and a second redistribution structure disposed on opposite sides of the substrate, wherein the first conductive through-via is in contact with the first redistribution structure, the sensor die is located between the second redistribution structure and the substrate, the second redistribution structure has a window located above a sensing region of the sensor die, and wherein outer sidewalls of the insulating encapsulant are offset from outer sidewalls of the substrate.

2. The semiconductor package as claimed in claim 1, wherein an interface between the first conductive through-via and the second conductive through-via is solder-free.

3. The semiconductor package as claimed in claim 1, further comprising an adhesive layer between the sensor die and the substrate.

4. The semiconductor package as claimed in claim 1, wherein a first width of the substrate is wider than a second width of the insulating encapsulant and a third width of the second redistribution structure.

5. The semiconductor package as claimed in claim 4, wherein the second width of the insulating encapsulant is substantially equal to the third width of the second redistribution structure.

6. The semiconductor package as claimed in claim 1, wherein the insulating encapsulant is in contact with and partially covers the substrate.

7. The semiconductor package as claimed in claim 1, wherein the first conductive through-via has a first surface in contact with the second conductive through-via and a second surface opposite to the first surface, and a dimension of the first surface is less than a dimension of the second surface.

8. A semiconductor package, comprising:
   a substrate comprising a first conductive through-via;
   a sensor die and a second conductive through-via on a first surface of the substrate;
   an insulating encapsulant laterally encapsulating the sensor die and the second conductive through-via, the insulating encapsulant being in contact with the first surface of the substrate, wherein a sum of a height of the first conductive through-via and a height of the second conductive through-via is substantially equal to a sum of a thickness of the substrate and a thickness of the insulating encapsulant, and wherein outer sidewalls of the insulating encapsulant are offset from outer sidewalls of the substrate;
   a front-side redistribution structure on the sensor die, the insulating encapsulant and the second conductive through-via, wherein the front-side redistribution structure has a window located above a sensing region of the sensor die; and
   a back-side redistribution structure on a second surface of the substrate.

9. The semiconductor package as claimed in claim 8, wherein an interface between the first conductive through-via and the second conductive through-via is solder-free.

10. The semiconductor package as claimed in claim 8, further comprising a die-attach film (DAF) or a thermal interface material (TIM) between the sensor die and the substrate.

11. The semiconductor package as claimed in claim 8, wherein the substrate extends beyond lateral extents of the insulating encapsulant and the front-side redistribution structure.

12. The semiconductor package as claimed in claim 8, wherein outer sidewalls of the insulating encapsulant are substantially aligned with outer sidewalls of the front-side redistribution structure.

13. The semiconductor package as claimed in claim 8, wherein the first conductive through-via is substantially aligned with the second conductive through-via.

* * * * *